United States Patent [19]
Ommen et al.

[11] Patent Number: 5,397,917
[45] Date of Patent: Mar. 14, 1995

[54] SEMICONDUCTOR PACKAGE CAPABLE OF SPREADING HEAT

[75] Inventors: Denise M. Ommen, Phoenix; Chi-Taou Tsai, Chandler; John Baird, Scottsdale, all of Ariz.

[73] Assignee: Motorola, Inc., Schaumburg, Ill.

[21] Appl. No.: 51,954

[22] Filed: Apr. 26, 1993

[51] Int. Cl.6 ............... H01L 23/02; H01L 23/12
[52] U.S. Cl. .................... 257/698; 257/700; 257/712; 257/774; 257/778; 361/707; 361/711; 361/717; 174/16.3
[58] Field of Search ............... 257/686, 698, 700, 703, 257/706, 712, 720, 774, 668, 675, 702, 717, 778; 361/704, 707, 711, 717, 718, 719; 174/16.3

[56] References Cited

U.S. PATENT DOCUMENTS

| | | | |
|---|---|---|---|
| 3,560,257 | 2/1971 | Schneble, Jr. et al. | 257/774 |
| 4,225,900 | 9/1980 | Ciccio et al. | 257/774 |
| 4,394,712 | 7/1983 | Anthony | 257/698 |
| 4,700,473 | 10/1987 | Freyman et al. | 29/846 |
| 4,739,448 | 4/1988 | Rowe et al. | 361/386 |
| 4,835,598 | 5/1989 | Higuchi et al. | 257/675 |
| 4,941,067 | 7/1990 | Craft | 257/720 |
| 5,051,811 | 9/1991 | Williams et al. | 257/774 |
| 5,151,771 | 9/1992 | Hiroi et al. | 257/676 |
| 5,235,211 | 8/1993 | Hamburgen | 257/700 |
| 5,241,456 | 8/1993 | Marcinkiewicz et al. | 257/700 |

*Primary Examiner*—Rolf Hille
*Assistant Examiner*—David Ostrowski
*Attorney, Agent, or Firm*—Rennie William Dover

[57] ABSTRACT

A package (10, 37, 39) capable of spreading heat from a semiconductor die (25). The package (10, 37) includes a heat spreader (11) having a thickness of approximately 0.2 millimeters and a plurality of heat spreader clearance holes (16). The heat spreader (11) is coated with an adhesive material (17) which fills the plurality of heat spreader clearance holes (16). A substrate layer (18) is formed on the adhesive material (17). The substrate layer (18) has conductive traces (20, 24) and conductive pads (21) disposed thereon. A cavity (23) may be present in the package (10, 37, 39) which exposes a portion of the heat spreader (11) and is adapted to receive the semiconductor die (25). The cavity (23) is covered by a cavity sealing means (30, 38).

15 Claims, 5 Drawing Sheets

SEMICONDUCTOR PACKAGE CAPABLE OF SPREADING HEAT

BACKGROUND OF THE INVENTION

The present invention relates, in general, to semiconductor devices and, more particularly, to transmitting heat away from semiconductor devices.

Semiconductor device manufacturers are constantly striving to reduce semiconductor device sizes while simultaneously increasing their speeds. An important consideration in making small, high speed, high circuit density semiconductor devices is providing packages capable of dissipating the heat generated by the devices. Typically, semiconductor device packages are designed such that a heat transfer medium is placed as close as possible to the source of heat i.e., the semiconductor device, and the surface area from which heat transfer occurs is optimized.

One response to the challenge of providing packages for small high density semiconductor devices has been the development of thin or low profile packages which employ printed circuit board substrates as a portion of the device package. One such package type is an over-molded pad array carrier. These packages offer many advantages over conventional package types such as dual in-line packages, plastic leaded chip carriers, and quad flat packs. For example, low profile packages do not have leads extending from the package edge in a linear array and thus do not present lead co-planarity nor skew problems during re-flow processes used to attach the package to a circuit board. Further, these packages occupy less space and offer lower lead inductance than conventional packages.

Low profile packages include thermal through-hole vias for transmitting or dissipating heat from the semiconductor devices. Although these vias provide a means for heat dissipation while maintaining a low profile package, they occupy a significant portion of the package and therefore occupy space which could be used for signal vias. Further, the thermal vias are effectively holes which provide a path for moisture and other contaminants to enter the packages.

Accordingly, it would be advantageous to have a method and an apparatus for spreading heat away from a semiconductor die housed within a low profile package. Further, the method and apparatus should not significantly increase the thickness nor the non-planarity of the package. It would be further advantageous that the method and apparatus not compromise the reliability of the package by allowing moisture to enter the package.

Summary of the Invention

Briefly stated, the present invention provides a package and a method for spreading heat away from a semiconductor die. One aspect of the present invention is a package for spreading heat away from a semiconductor device comprising a heat spreader positioned in a multi-layer board. The heat spreader package includes electrically isolated vias that provide an electrical connection through the heat spreader, a semiconductor die receiving means, a semiconductor die mounted on the semiconductor die receiving means, and a semiconductor die covering means.

In another aspect, the present invention provides a method for fabricating a package which is capable of removing heat from a semiconductor die. The method of the present invention includes providing a heat spreader having a plurality of heat spreader clearance holes and coating the heat spreader with an adhesive material which fills the plurality of heat spreader clearance holes. The present invention further includes providing an insulator layer on the adhesive material, providing at least one foil over the insulator layer, and forming a plurality of signal vias which are substantially concentric with the plurality of heat spreader clearance holes. In addition, the method includes providing a region adapted to receive a semiconductor die, placing a semiconductor die in the region adapted to receive the semiconductor die, and covering the semiconductor die.

DETAILED DESCRIPTION OF THE DRAWINGS

Figure 1:
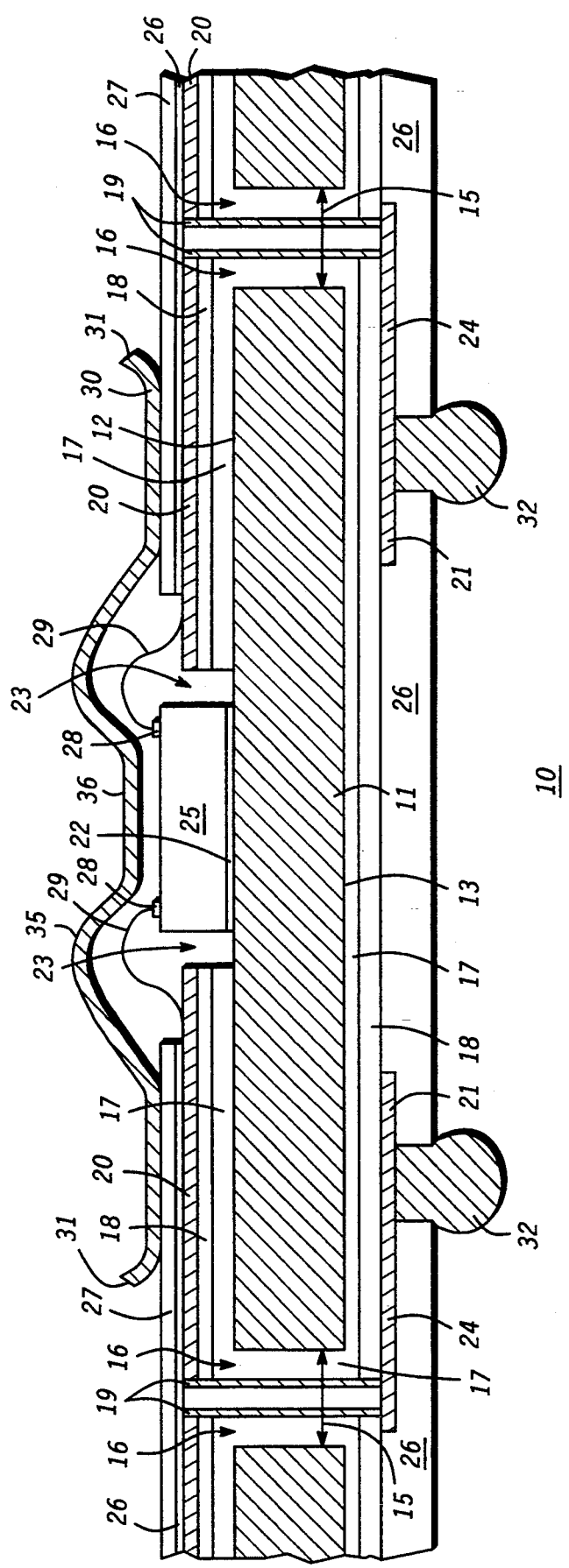
FIG. 1 illustrates a cross-sectional view of a first embodiment of a pad array carrier package in accordance with the present invention.
Figure 2:
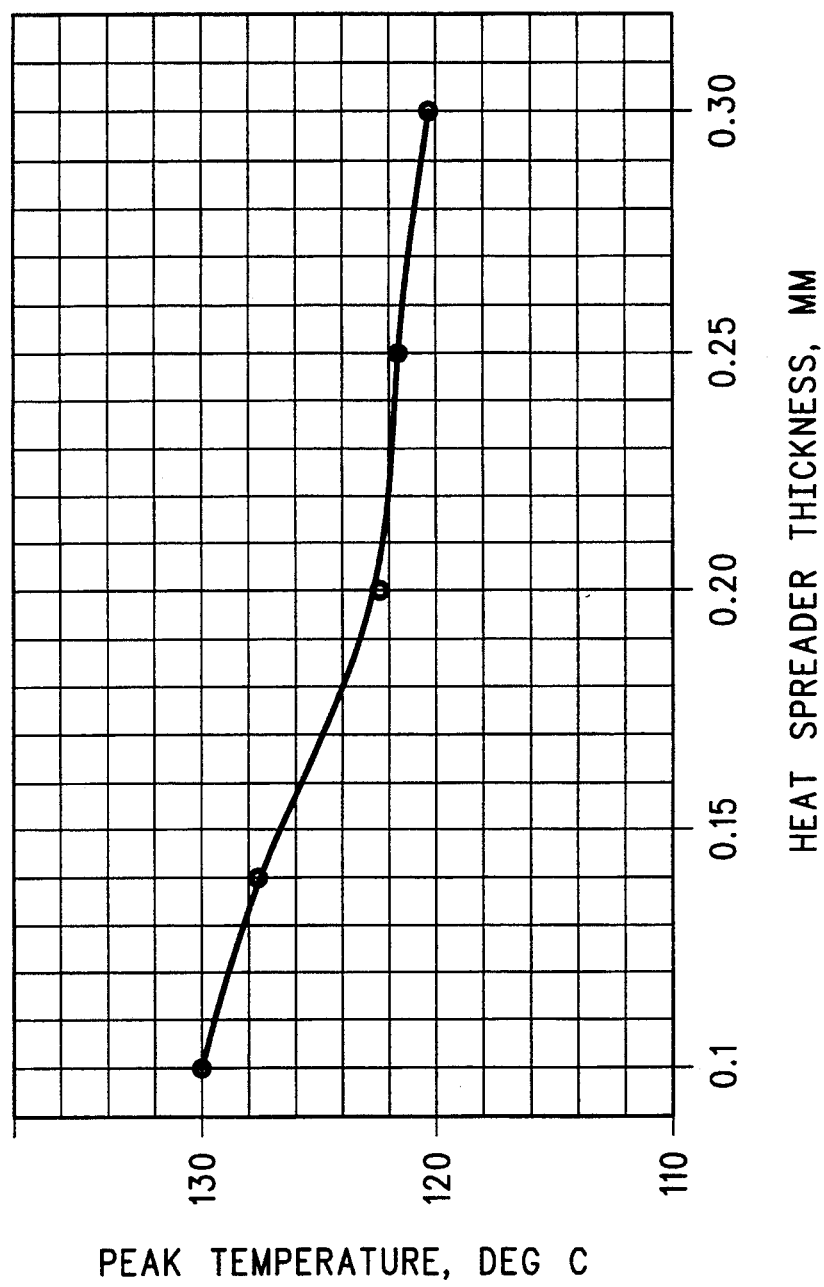
FIG. 2 is a plot of a packaged semiconductor die temperature versus a heat spreader thickness.

FIG. 1 illustrates a cross-sectional view of a first embodiment of a pad array carrier package 10. Pad array carrier package 10 is a semiconductor package which comprises a heat spreader 11 having a first major surface 12 and a second major surface 13. Major surface 12 is also referred to as a top side and major surface 13 is referred to as a bottom side. Preferably, heat spreader 11 is a thermally conductive material such as, for example, copper having a thickness of approximately 0.2 millimeters. It shall be understood that an important aspect of the present invention is the thickness of heat spreader 11. FIG. 2 illustrates a plot of package temperatures versus the thickness of heat spreader 11. For heat spreader thicknesses less than approximately 0.1 millimeters, a significant amount of heat remains within the package. Thus, an integral part of the present invention is having a thick thermally conductive plane known as a heat spreader 11 wherein its thickness is greater than that found in conventional signal or ground planes.

Although not shown, it shall be understood that heat spreader 11 may be set at a fixed potential by providing a via to the heat spreader and coupling the heat spreader to the fixed potential. More particularly, the heat spreader may also serve as a ground plane by coupling a ground potential to the heat spreader.

Figure 3:
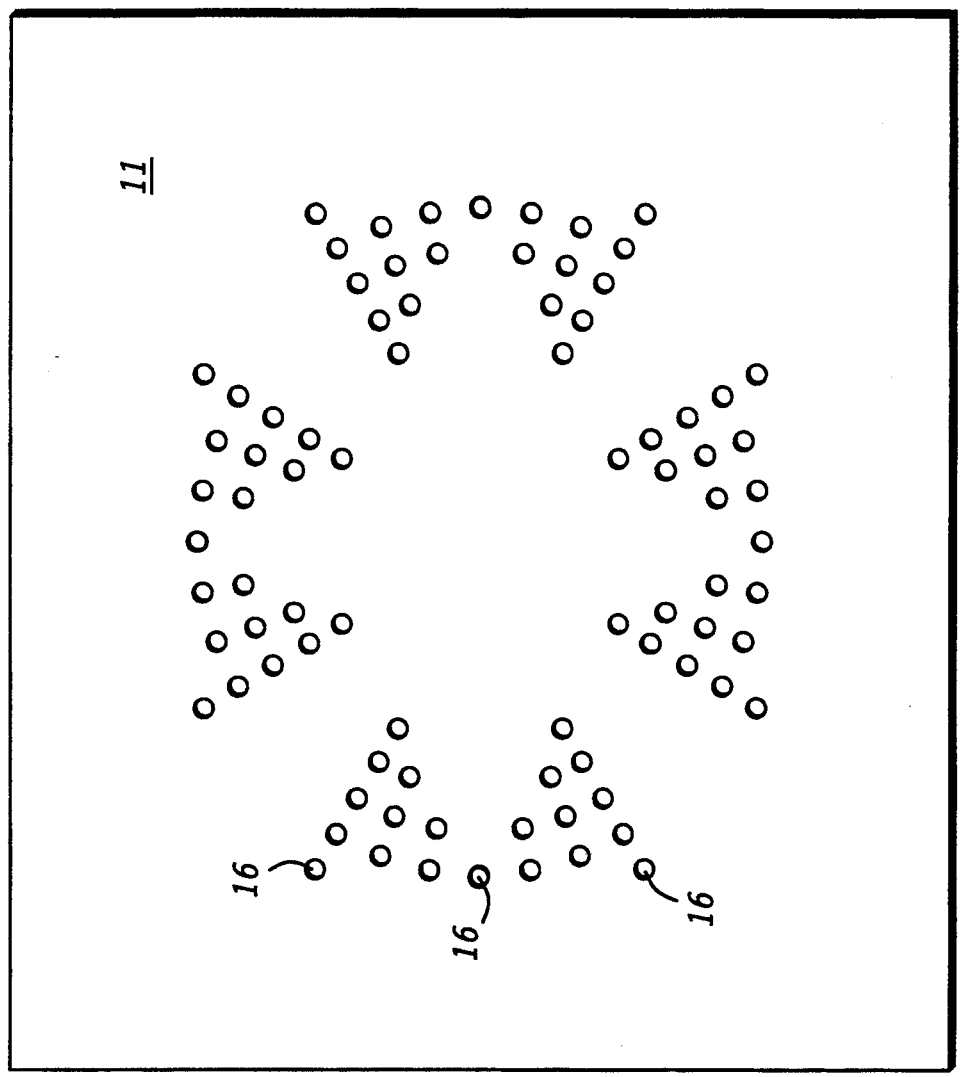
FIG. 3 illustrates a top view of a heat spreader shown in FIG. 1.

Heat spreader 11 has a plurality of apertures or holes 16 extending therethrough. After they are formed and prior to any subsequent processing, holes 16 have a first diameter indicated by arrows 15. Holes 16 extend through heat spreader 11 and are also referred to as heat spreader clearance holes or more simply clearance holes. FIG. 3 is a top view of heat spreader 11 of FIG. 1 illustrating clearance holes 16 patterned in a radial array. Although clearance holes 16 may be in a peripheral array, an area array, a combination thereof, etc., it is preferable that clearance holes 16 be in a radial array to optimize the package size. In one example, clearance holes 16 have a diameter of approximately 0.6 millimeters.

Heat spreader 11 is coated with an electrically nonconductive adhesive material 17 which fills clearance holes 16. Preferably, adhesive material 17 is a combination of a reinforcement fiber and a resin. Suitable reinforcement fibers include glass, aramid, ceramic, or the like. Suitable resins, on the other hand, include epoxy, polyimide, triazine, phenolic resins, or the like. Thus, adhesive material 17 coats first and second major surfaces 12 and 13, respectively. The ratio of glass fiber to resin is selected to provide adhesive material 17 with an amount sufficient to allow adhesive material 17 to fill clearance holes 16. Adhesive material preparations having such properties are commonly referred to as prepreg. In one example, adhesive material 17 has a thickness of approximately 0.086 millimeters.

A substrate or insulator layer 18 is formed on adhesive material 17, wherein substrate layer 18 may be a layer of dielectric material. Substrate layer 18 may cover, for example, the adhesive material 17 on both sides of heat spreader 11 wherein the thickness of substrate layer 18 on each side of heat spreader 11 is approximately 0.13 millimeters. The bulk material used for substrate layer 18 is preferably a glass fabric-reinforced resin, such as an epoxy, polyimide, triazine, or phenolic resin. More specifically, a bismaleimidetriazine (BT) resin is preferred; however, other substrate materials are also suitable.

For instance, various epoxy-glass composites, printed circuit board materials, flexible circuits or ceramic substrates may be used. Also, reinforcements other than glass can be used in the substrate. Examples of other suitable reinforcements include aramid and ceramic fibers. Likewise, particle reinforcement may be used instead of fibers. Adhesive material 17 and substrate 18 are cured using conventional processes. As those skilled in the art will recognize, curing adhesive material 17 and substrate 18 at a pressure ranging between approximately 7 atmospheres (approximately 532 centimeters of mercury) and 35 atmospheres (approximately 2,660 centimeters of mercury) renders them indistinguishable from one another.

A top-side conductive trace 20 is formed over first major surface 12, a bottom-side conductive trace 24 is formed over second major surface 13, and a conductive pad 21 is formed over second major surface 13 and coupled to top-side conductive trace 20 via bottom-side conductive trace 24. Top-side conductive traces 20, bottom-side conductive traces 24, and conductive pads 21 are typically formed on substrate layer 18 by laminating an electrically conductive foil or by plating a conductive film to the dielectric material, wherein the conductive material used is preferably copper. Traces 20 and 24, and pads 21 are defined by patterning the foil using lithographic techniques. Thus, substrate 18 has a foil disposed thereon. Alternatively, traces 20 and 24, and pads 21 may be screen printed or otherwise deposited onto surfaces of the substrate.

Conductive pads 21 are typically plated with gold to establish a non-oxidizable surface suitable for soldering. For purposes of clarity, conductive pads 21 are illustrated as being a single layer of material that is continuous with conductive traces 24 throughout the description of the present invention. Although conductive pads 21 may be patterned in a peripheral array, an area array, a combination thereof, etc., it is preferable that conductive pads 21 be in a radial array to increase the number of conductive pads per unit area and to decrease the probability of two conductive pads becoming electrically shorted together. As those skilled in the art will recognize, top-side conductive traces 20, bottom-side conductive traces 24, and conductive pads 21 are patterned to form circuit interconnects.

Resin filled clearance holes 16 and layers 17 and 18 are drilled in preparation for forming signal vias 19, wherein signal vias 19 are substantially concentric with clearance holes 16, have a smaller outer diameter than clearance holes 16, and are electrically isolated from heat spreader 11. The drilled holes are then plated with copper to form signal vias 19 which are also referred to as electrically isolated vias. In other words, signal vias 19 are formed by removing a portion of adhesive material 17 filling clearance holes 16 followed by plating with an electrically conductive material such as, for example, copper. The portion of adhesive material 17 remaining in clearance holes 16 serves to electrically isolate signal vias 19 from heat spreader 11. Thus, signal vias 19 are electrically isolated from heat spreader 11. Vias such as signal vias 19 are typically formed by drilling holes through the electrically nonconductive adhesive material 17 which fills clearance holes 16 followed by plating to form signal vias 19. In the example, the outer diameter of drilled signal vias 19 is approximately 0.3 millimeters. After plating, signal vias 19 of the example have an inside diameter of approximately 0.26 millimeters. A conductive trace 20 is electrically coupled to a corresponding conductive pad 21 by plated signal vias 19 and bottom conductive traces 24.

In accordance with the present invention, dielectric material 18 includes a least one opening 23. Opening 23 is preferably punched or routed out of dielectric material 18 after conductive traces 20 and 24, and conductive pads 21 have been formed. Opening 23 can be created at any point in the manufacturing process and need not be punched. For reasons related to the shape of most conventional semiconductor die, opening 23 is preferably rectangular. As those skilled in the art will recognize, opening 23 is not limited to a rectangular shape, but may have any shape suitable for accepting at least one semiconductor die.

Opening 23 exposes a portion of first major surface 12 of heat spreader 11. Together, the exposed portion of heat spreader 11 and the sidewalls formed by opening 23 form a cavity for receiving at least one semiconductor die 25 which serves as a semiconductor die receiving means. In other words, the cavity is adapted to receive semiconductor die 25. Semiconductor die 25 is mounted to heat spreader 11 by a conventional die attach material 22 such as silver filled epoxy. Preferably, a top surface of semiconductor die 25 is approximately co-planar with a top surface of dielectric material 18 so that package 10 is kept as thin as possible. Further, keeping semiconductor die 25 approximately planar with the top surface helps maintain the planarity of package 10. However, the top surface of semiconductor die 25 could be raised above or recessed below the top surface of dielectric material 18.

A solder mask layer 26 is patterned over conductive traces 20 and 24 and over conductive pads 21. Suitable solder mask materials include polyimide, high temperature epoxy resins, or the like. Methods of patterning solder mask layers are well known to those skilled in the art. Using conventional wirebonding techniques, bonding pads 28 are coupled to conductive traces 20 via conductive wires 29, which may be, for example, gold wires. Although conductive traces 20 are shown as a single layer, it shall be understood that there may be more than one layer of conductive traces 21 being wire-bonded to bonding pads 28.

In the first embodiment, a protective metal cap 30 is bonded to solder mask 26 using an adhesive material 27. Thus, protective cap 30 serves as a means for protectively covering semiconductor die 25. Protective cap 30 covers and protects semiconductor die 25 from mechanical stresses as well as promotes heat removal from the semiconductor die. Further, protective metal cap 30 lowers the lead inductance of the package, increases the resonant frequency of the package, and helps to improve electromagnetic interference performance. These benefits are obtained by optimizing the shape of protective cap 30 for thermal conduction and by selecting a material for protective cap 30 that optimizes the electrical and thermal characteristics of pad array carrier package 10.

In one example of the first embodiment, protective cap 30 comprises a coined sheet of metal wherein the step of coining the sheet of metal creates a raised portion 35 surrounding a central depression 36. Central depression 36 is substantially planar with the unraised portion of the sheet of metal. Moreover, coining forms lips 31 along the periphery of the sheet of metal to rigidize the edge.

Since protective cap 30 is metal, it serves as a heat spreader by promoting thermal conduction away from semiconductor die 25. Central depression 36 is formed so that protective cap 30 is as close to semiconductor die 25 as possible, further facilitating the transfer of heat away from semiconductor die 25. In addition, protective cap 30 is coined to have raised portions 35 which allow protective cap 35 to be over conductive wires 29 without touching them. In other words, protective cap 30 is contoured so that conductive wires 29 do not touch protective cap 30 and thus conductive wires 29 are electrically isolated from protective cap 30. Lips 31 are coined to promote a greater aesthetic appearance by preventing solder mask material 26 or adhesive material 27 from being squeezed out from under and around the edge of protective cap 30.

Another important aspect of the present invention is the material of protective cap 30. Preferably, the material of protective cap 30 is selected such that its coefficient of thermal expansion matches that of the combination of layers 17 and 18, and heat spreader 11. Moreover, it is desirable that the material lower the lead inductance of the package as well as allowing operation at higher frequencies, i.e., increase the resonant frequency of the package.

The selection of the material is a function of the desired parameter to be optimized. For example, a suitable material for digital circuit applications, in which it is desired to optimize lead inductance and the resonant frequency, is a bi-metal laminated cap comprising a layer of iron and a layer of aluminum. Preferably the iron layer has a thickness of approximately 150 micrometers and the aluminum layer has a thickness of approximately 450 micrometers. The iron side of the bi-metal structure faces the semiconductor die. On the other hand, in analog applications operating at greater than one gigahertz it is desirable to optimize impedance matching. Although the aforementioned material is suitable for analog applications, optimization is achieved by placing protective cap 30 such that the aluminum side faces semiconductor die 25. A protective cap 30 comprised of copper is also suitable for the analog applications. Moreover, in cases wherein matching of coefficients of thermal expansion is desirable, the bi-metal protective cap provides desirable results. Further, the positioning of protective cap relative to clearance holes 16 is not a limitation of the present invention. In other words, protective cap 30 may not be positioned over a clearance hole 16, or it may be positioned over one or more clearance holes 16.

Solder bumps 32 are formed on conductive pads 21 by physically positioning each solder ball on a pad 21 in the presence of a flux and performing a solder re-flow operation to form a metallurgical bond.

Figure 4:
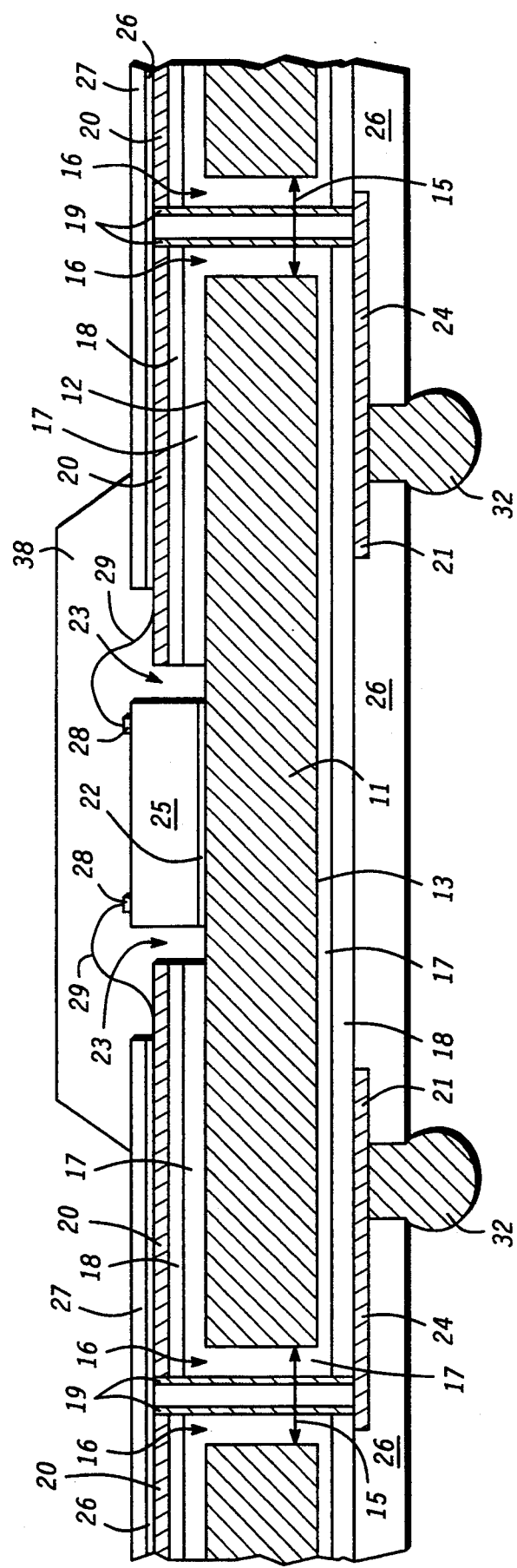
FIG. 4 illustrates a cross-sectional view of a second embodiment of a pad array carrier package in accordance with the present invention.

FIG. 4 is a cross-sectional view of a second embodiment of a semiconductor package 37. Since several of the elements of pad array carrier package 37 have been described with reference to FIG. 1, like numerals are used to designate identical or corresponding elements in FIG. 4. Semiconductor package 37 is the same as pad array carrier package 10 with the exception of protective cap 30 shown in FIG. 1. In the second embodiment, semiconductor die 25 is protected by a molded plastic body 38 which serves as a means for protectively covering semiconductor die 25. Molded plastic body 38 is formed from a mold compound such as, for example, a particulate filled epoxy. Methods of forming molded plastic bodies are known to those skilled in the art.

Figure 5:
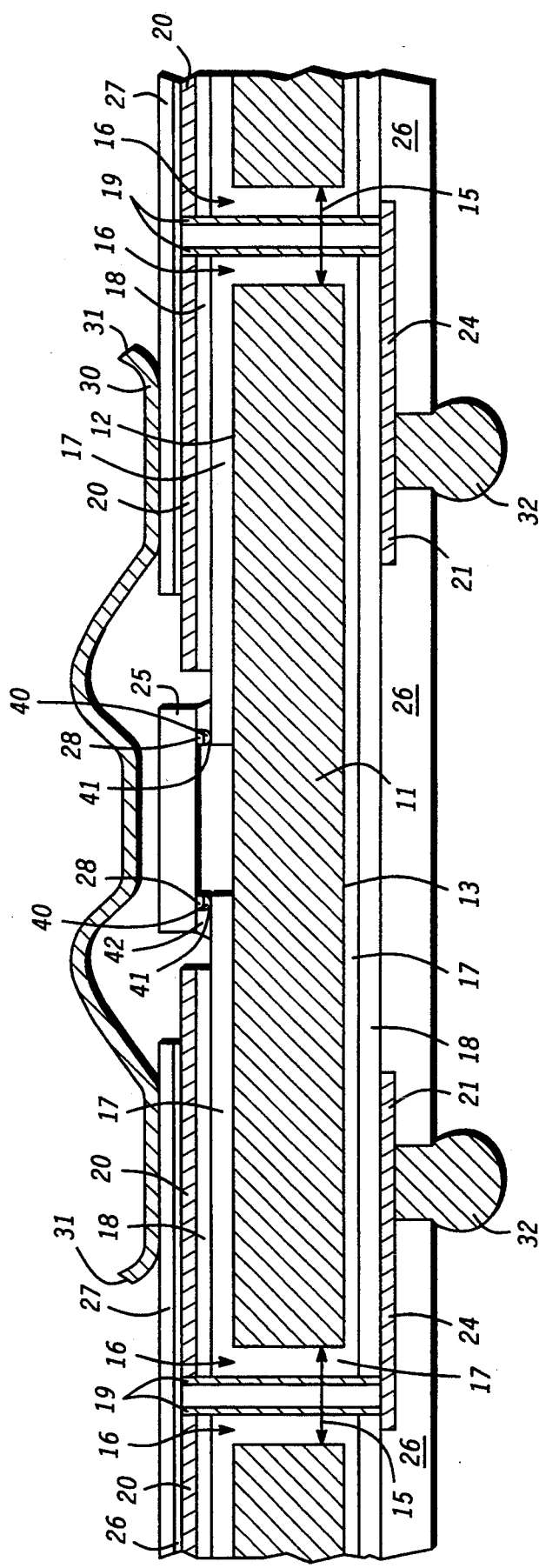
FIG. 5 illustrates a cross-sectional view of a flip-chip embodiment of a pad array carrier package in accordance with the present invention.

FIG. 5 illustrates yet another embodiment of the present invention, in which semiconductor die 25 is directly attached to conductive traces 20. To maintain the continuity of the description of the present invention, elements of FIG. 5 that are identical to elements of FIG. 1 have been assigned like reference numerals. In the embodiment of FIG. 5, semiconductor die 25 has been flipped and bonded to conductive traces 20 in a process commonly referred to as flip-chip bonding or direct die attach. Methods of performing flip-chip bonding are known and include fusing bumps 40, which are formed on bonding pads 28 on the semiconductor die, with pads 41 formed on conductive traces 20. Thus, fusing bumps 40 form a portion of the region adapted to receive the semiconductor die 25. Subsequently, the electrical connection formed between the bonding pads 28 and pads 41 are stabilized by flooding the area under semiconductor die 25 with a liquid potting material 42 followed by curing potting material 42. Potting material 42 may be, for example, a glob top compound. As in the previous embodiments, a solder mask layer 26 and an adhesive material 27 are patterned over conductive traces 20. Then, protective metal cap 30 is bonded to solder mask 26 using an adhesive material 27. Protective cap 30 is contoured to fit over semiconductor die 25 and includes lips 31.

An advantage of the flip-chip embodiment of FIG. 5 is that an opening such as opening 23 is not formed, thereby decreasing manufacturing costs and cycle time. Direct bonding of semiconductor die 25 to conductive traces 20 mitigates parasitic effects such as parasitic inductances and transmission line effects of the relatively long gold wires. Further, the thickness of the package is not increased because of the elimination of conductive wires 29 which are required in the embodiment of FIG. 1.

In another flip-chip embodiment (not shown) of the present invention, a semiconductor die is protected by a molded plastic body. This embodiment comprises a combination of the elements of FIGS. 4 and 5. More particularly, a semiconductor die is flip-chip bonded to conductive traces as discussed with respect to FIG. 5. However, protective metal cap 30 of FIG. 5 is replaced by a molded plastic body similar to that described in FIG. 4. Again, the molded plastic body is formed from a mold compound such as, for example, a particulate filled epoxy, wherein methods of forming molded plastic bodies are well known to those skilled in the art.

By now it should be realized that an apparatus and a method have been provided for forming a semiconductor package. The semiconductor package includes a heat spreader positioned in a multi-layer board having a plurality of clearance holes patterned in a radial array or in a rectilinear array and extending therethrough. The clearance holes allow transmission of electrical signals from a top side of the heat spreader to the bottom side of the heat spreader as well as transfer of heat away from the heat spreader to top and bottom surfaces of the heat spreader. Shorting of the electrical signals with the heat spreader is prevented by lining the clearance holes in the heat spreader with an insulating resin made available from a prepreg sheet comprising reinforcement fibers and a resin. Moreover, the heat spreader serves to block transport of moisture from the bottom side of the pad array carrier into the cavity for receiving a semiconductor die.

In one embodiment, a protective cap is placed over the cavity housing the semiconductor die wherein the protective cap serves as means for covering the cavity for receiving the semiconductor die. The protective cap is contoured to facilitate heat removal from the semiconductor die as well as to accommodate conductive wires coupling bonding pads on the semiconductor die with conductive traces. Further, the protective cap prevents penetration of moisture from the top side of the pad array carrier. In another embodiment, a molded plastic body is formed over the semiconductor die. In yet another embodiment, an opening 23 is not formed and the semiconductor device 25 is flip-chip bonded to the package. Subsequently, the protective cap is placed over the die. Alternatively, a molded plastic body may encapsulate the semiconductor die 25. The protective cap and the molded plastic body serve as cavity sealing means, also referred to as cavity covering means.

Thus, the present invention provides a method and an apparatus for spreading heat in a semiconductor package. Heat spreading is accomplished without significantly increasing the thickness of the package or degrading the flatness of the package. Further, the present invention does not compromise the reliability of the package, but rather improves reliability by blocking the transport of moisture into the package.

We claim:

1. A semiconductor package capable of spreading heat, comprising:
    a heat spreader having a first surface, a second surface, and a plurality of clearance holes extending therethrough, each clearance hole having a diameter;
    an adhesive material coating the first and second surfaces;
    a substrate layer, the substrate layer covering the adhesive material;
    a top-side conductive trace, the tope-side conductive trace over the first surface;
    a bottom-side conductive trace, the bottom-side conductive trace over the second surface;
    a plurality of signal vias, each of the plurality of signal vias within a corresponding clearance hole and spaced apart from edges of the corresponding clearance hole by the adhesive material;
    a conductive pad, the conductive pad over the second surface and electrically coupled to the top-side conductive trace via the bottom-side conductive trace and at least one of the plurality of signal vias;
    a cavity for receiving a semiconductor die, the cavity exposing the first surface of the heat spreader; and
    a material for covering the cavity for receiving the semiconductor die.

2. A semiconductor package capable of spreading heat as claimed in claim 1, wherein the adhesive material is a combination of a reinforcement fiber and a resin.

3. A semiconductor package capable of spreading heat as claimed in claim 1, wherein the material for covering is a bi-metal laminated cap comprising a layer of aluminum and a layer of iron.

4. A semiconductor package capable of spreading heat as claimed in claim 1, wherein the materials for covering is shaped to facilitate heat removal and contoured to cover a conductive wire coupling the semiconductor die to the top-side conductive trace, the material for covering electrically isolated from the conductive wire.

5. A semiconductor package capable of spreading heat as claimed in claim 1, wherein the material for covering comprises a mold compound.

6. A semiconductor package capable of spreading heat as claimed in claim 1, wherein the heat spreader has a thickness of approximately 0.2 millimeters.

7. A semiconductor package capable of spreading heat as claimed in claim 1, wherein the clearance holes are formed in a radial array.

8. A semiconductor package capable of spreading heat as claimed in claim 3, wherein the material for covering has a coefficient of thermal expansion that matches the coefficient of thermal expansion of the combination of the adhesive material coating the first and second surfaces and the substrate layer covering the adhesive material.

9. A heat spreader package comprising:
    a heat spreader of substantially 0.2 millimeters thickness positioned in a multi-layer board having a top side and a bottom side;
    electrically isolated vias in the heat spreader for providing electrical connection through the heat spreader;
    semiconductor die receiving means, wherein the semiconductor die receiving means is on the top side of the multi-layer board and comprises a cavity exposing a portion of the heat spreader and the semiconductor die is attached to the portion of the heat spreader that is exposed by a die attach material;
    semiconductor die mounted on the semiconductor die receiving means; and
    means for protectively covering the semiconductor die.

10. The heat spreader package as claimed in claim 9 wherein the electrically isolated vias are electrically isolated from the heat spreader by an adhesive material comprising a reinforcement fiber and a resin.

11. A heat spreader package as claimed in claim 9, wherein the diameter of the electrically isolated vias is approximately 0.3 millimeters.

12. A heat spreader package as claimed in claim 9, wherein the means for protectively covering the semiconductor die comprises a metal cap.

13. A heat spreader package as claimed in claim 9, wherein the means for protectively covering the semiconductor die comprises a molded plastic body.

14. A heat spreader package as claimed in claim 9, wherein the semiconductor die receiving means comprises pads to which the semiconductor die is flip-chip bonded.

15. A heat spreader package as claimed in claim 9, wherein the means for protectively covering the semiconductor die has a coefficient of thermal expansion that matches the coefficient of thermal expansion of the multi-layer board.

* * * * *